United States Patent
Yanagita

(10) Patent No.: US 10,693,399 B2
(45) Date of Patent: Jun. 23, 2020

(54) MOTOR CONTROL DEVICE AND CURRENT RIPPLE DETECTION METHOD FOR DC MOTOR

(71) Applicant: MITSUBA Corporation, Gunma (JP)

(72) Inventor: Yuichi Yanagita, Gunma (JP)

(73) Assignee: MITSUBA CORPORATION, Gunma (JP)

( * ) Notice: Subject to any disclaimer, the term of this patent is extended or adjusted under 35 U.S.C. 154(b) by 0 days.

(21) Appl. No.: 16/338,642

(22) PCT Filed: Sep. 15, 2017

(86) PCT No.: PCT/JP2017/033456
§ 371 (c)(1),
(2) Date: Apr. 1, 2019

(87) PCT Pub. No.: WO2018/079128
PCT Pub. Date: May 3, 2018

(65) Prior Publication Data
US 2020/0044588 A1 Feb. 6, 2020

(30) Foreign Application Priority Data

Oct. 25, 2016 (JP) .................................. 2016-209080

(51) Int. Cl.
*H02P 7/06* (2006.01)
*H02P 7/00* (2016.01)
(Continued)

(52) U.S. Cl.
CPC ............... *H02P 7/06* (2013.01); *G01R 31/34* (2013.01); *H02K 13/10* (2013.01); *H02P 6/16* (2013.01);
(Continued)

(58) Field of Classification Search
CPC ...... H02P 1/00; H02P 6/00; H02P 6/10; H02P 1/04; H02P 1/46; H02P 1/24; H02P 1/26;
(Continued)

(56) References Cited

U.S. PATENT DOCUMENTS

| 6,559,616 B2 * | 5/2003 | Aoki ..................... H02P 7/2805 318/567 |
| 7,064,509 B1 * | 6/2006 | Fu ........................ H02P 7/2805 318/244 |

(Continued)

FOREIGN PATENT DOCUMENTS

| JP | 2006-166678 | 6/2006 |
| JP | 2007-236032 | 9/2007 |

(Continued)

OTHER PUBLICATIONS

International Search Report dated Dec. 12, 2017 in International (PCT) Application No. PCT/JP2017/033456.

(Continued)

*Primary Examiner* — Antony M Paul
(74) *Attorney, Agent, or Firm* — Wenderoth, Lind & Ponack, L.L.P.

(57) ABSTRACT

A ripple detection device 10 includes: a current detection part 11 that outputs a variation in an armature current as a voltage variation signal; a first smoothing circuit block 12 that extracts a current ripple component and a noise component from the voltage variation signal and outputs a first smoothing signal S1; a gain adjustment part 13 that adjusts the amplitude of the first smoothing signal S1 and outputs an adjustment signal VCA; a second smoothing circuit block 14 that corrects distortion of the adjustment signal VCA and outputs a second smoothing signal S2; a ripple detection part 15 that extracts only the current ripple component from the second smoothing signal S2 by removing the noise component therefrom and outputs a ripple component signal S0;

(Continued)

and a digital signal conversion part 16 that converts the ripple component signal S0 into a digital signal.

14 Claims, 9 Drawing Sheets

(51) Int. Cl.
*H02K 13/10* (2006.01)
*G01R 31/34* (2020.01)
*H02P 6/16* (2016.01)
*H02P 7/03* (2016.01)

(52) U.S. Cl.
CPC .............. *H02P 7/0094* (2013.01); *H02P 7/03* (2016.02); *H02P 2203/09* (2013.01)

(58) Field of Classification Search
CPC ...... H02P 1/42; H02P 3/00; H02P 3/18; H02P 7/00; H02P 7/0094; H02P 7/0066; H02P 8/00; H02P 23/00; H02P 25/00; H02P 27/00; H02P 27/04; H02P 27/06; H02P 21/00
USPC .... 318/400.32, 400.01, 400.14, 400.15, 700, 318/701, 727, 721, 799, 779, 800, 801, 318/430, 432, 599, 811, 400.23
See application file for complete search history.

(56) References Cited

U.S. PATENT DOCUMENTS

| | | | | |
|---|---|---|---|---|
| 7,668,690 B2* | 2/2010 | Schneider | ................. | G01P 3/44 318/470 |
| 8,138,712 B2* | 3/2012 | Yamada | ................... | H02M 1/12 318/807 |
| 8,169,178 B2* | 5/2012 | Letor | ........................ | G01P 3/48 318/286 |
| 8,310,185 B2* | 11/2012 | Knezevic | ............... | H02K 23/30 318/400.12 |
| 8,525,464 B2* | 9/2013 | Tanaka | ...................... | G01P 3/48 318/490 |

FOREIGN PATENT DOCUMENTS

| | | |
|---|---|---|
| JP | 2009-159674 | 7/2009 |
| JP | 2016-77130 | 5/2016 |

OTHER PUBLICATIONS

International Preliminary Report on Patentability dated May 9, 2019 in International (PCT) Application No. PCT/JP2017/033456.

* cited by examiner

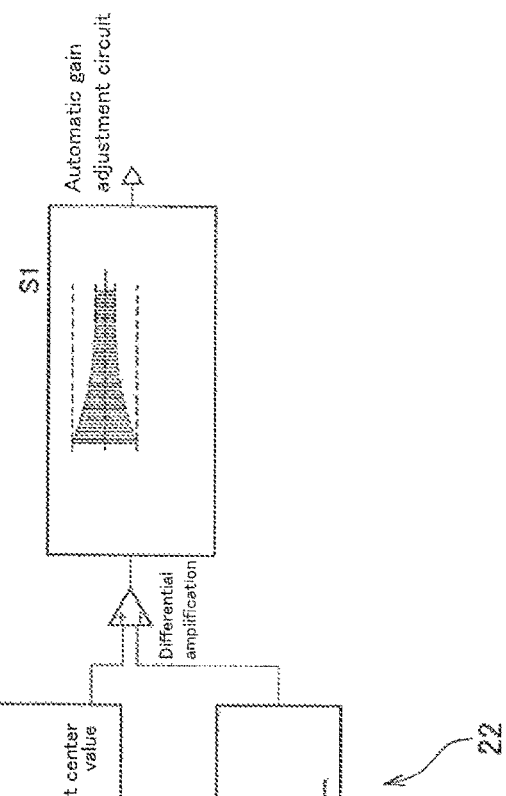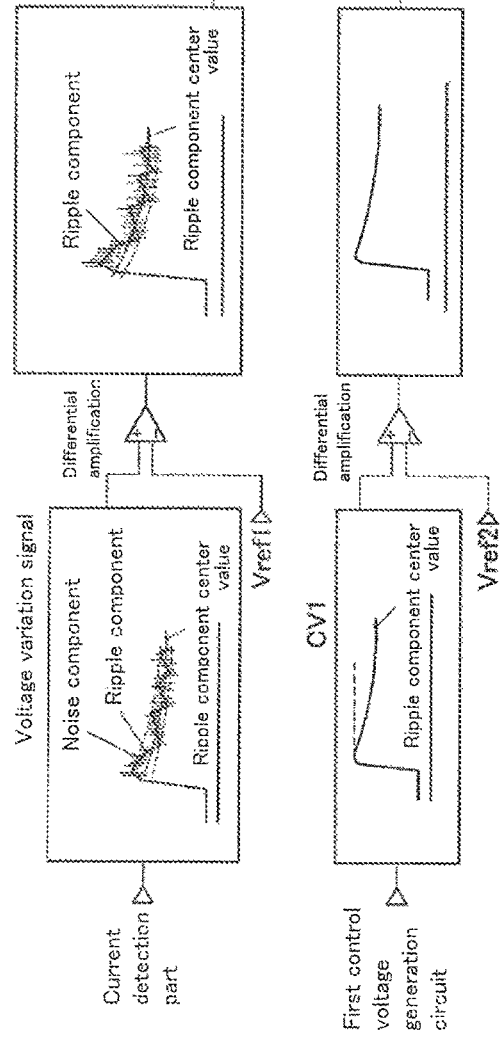

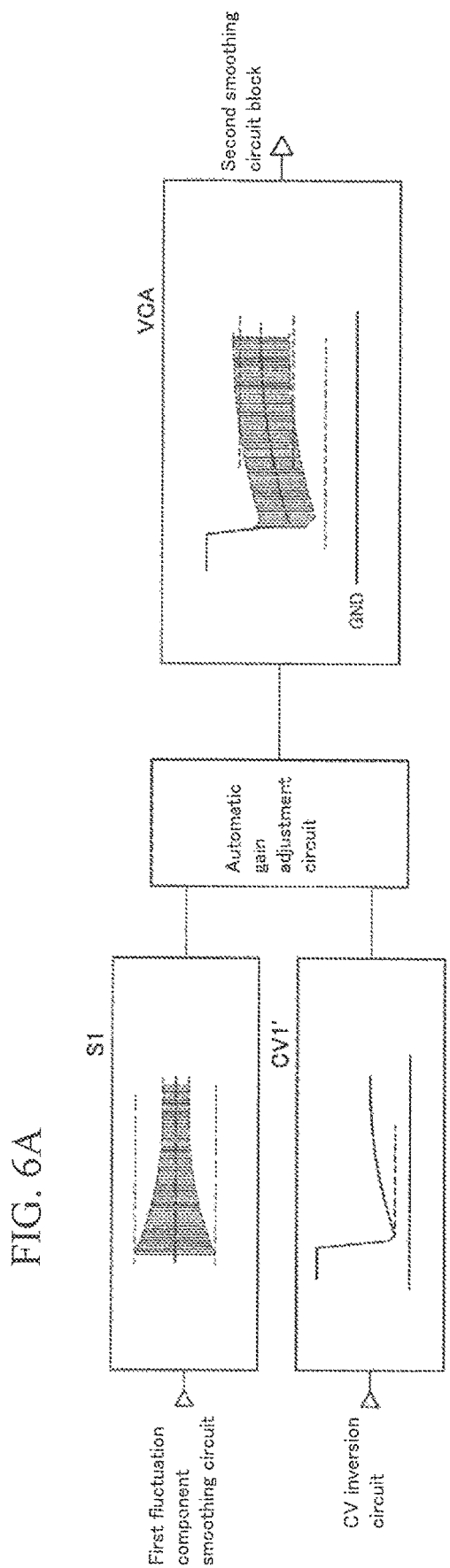

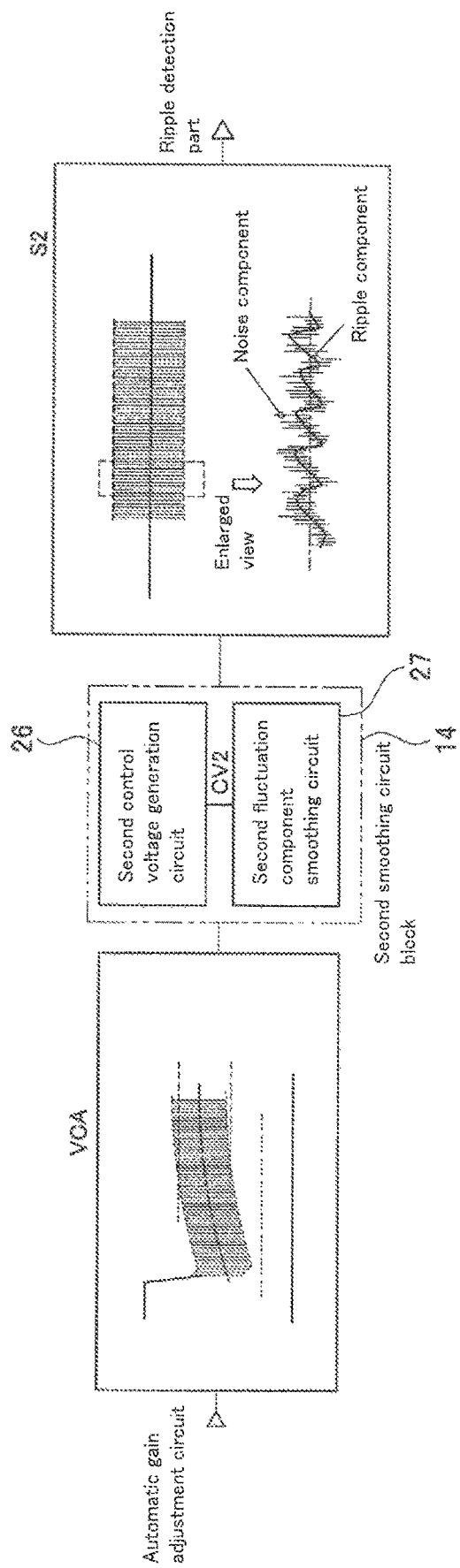

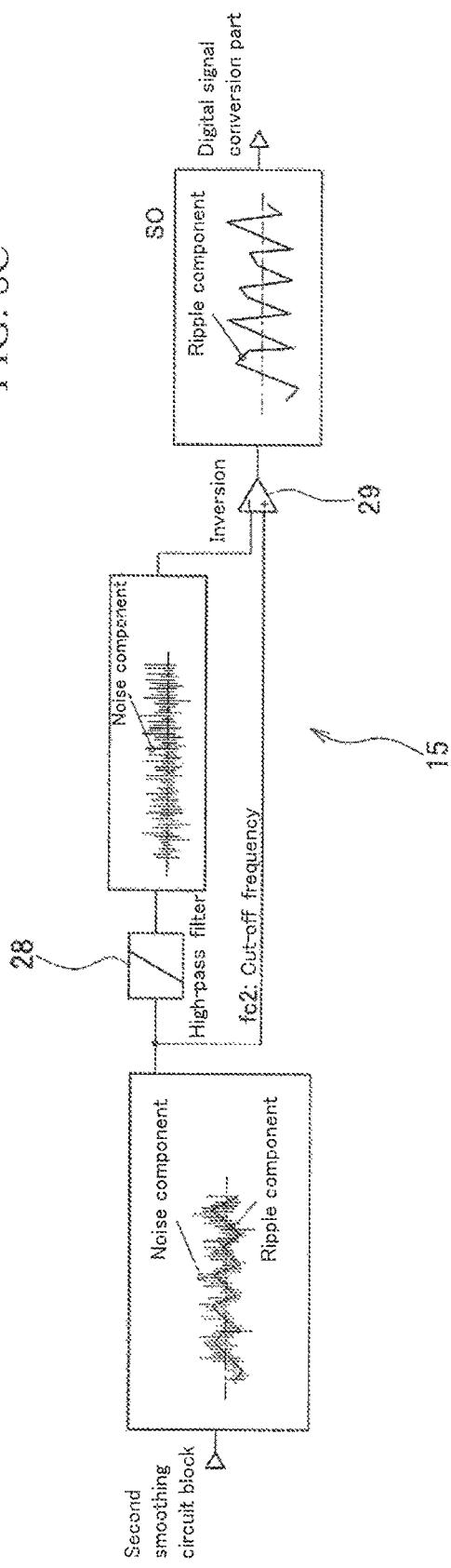

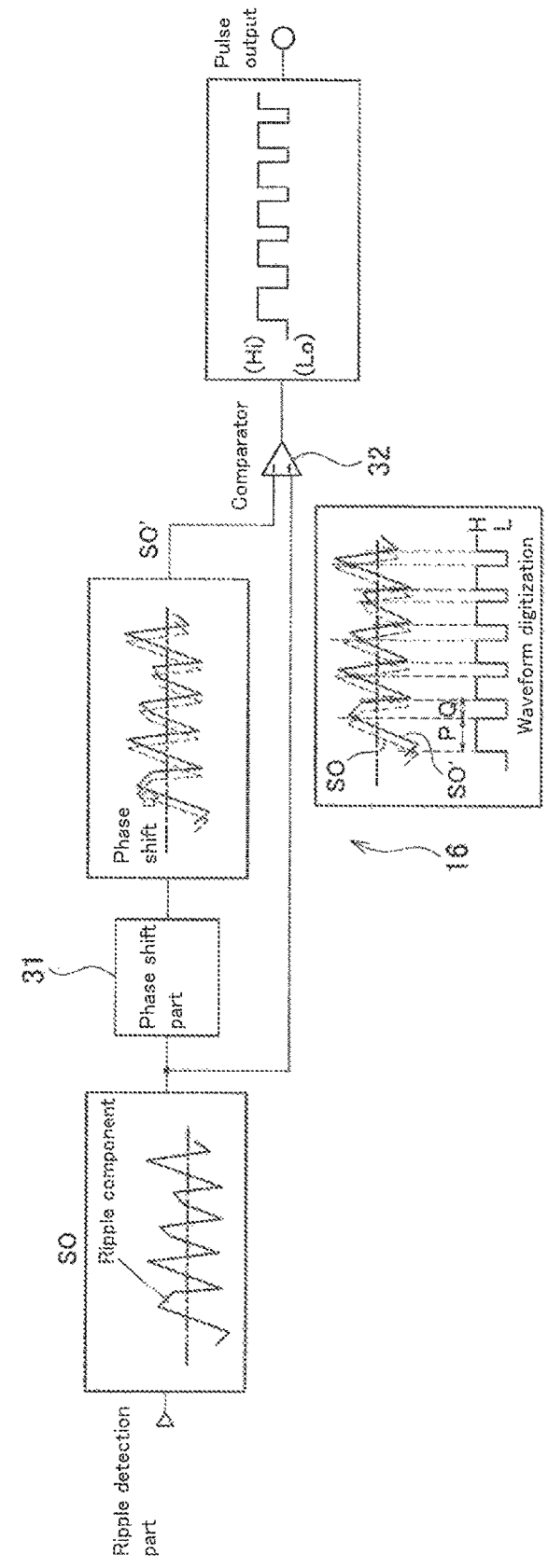

MOTOR CONTROL DEVICE AND CURRENT RIPPLE DETECTION METHOD FOR DC MOTOR

TECHNICAL FIELD

The present invention relates to a control technique for a DC motor and, more particularly, to a motor control device capable of detecting a motor rotation speed, a motor rotation direction, and the like without use of a sensing element such as a hall IC or a rotation detection member such as a rotary encoder or a tacho-generator.

BACKGROUND ART

As a method of detecting the rotation speed or rotation angle of a DC motor with a brush taken to control the operation of the motor, there is conventionally known so-called sensorless positioning that utilizes a current ripple caused when contact between a brush and a commutator segment is switched. Generally, the motor current (armature current) of the DC motor with a brush rises at an inclination according to the inductance of a motor winding when the commutator segment contacting the brush is switched from one to another and then varies according to the difference between a power supply voltage and a counter-electromotive voltage. That is, the motor current is not constant but involves a pulsation (ripple) corresponding to a motor rotation position.

Such a current ripple is superimposed on a motor current. Thus, there have been proposed various methods of detecting the motor rotation speed, motor rotation direction, and the like without use of a rotation detection member such as a hall IC by extracting the current ripple from the motor current, followed by detection of a characteristic waveform from the extracted current ripple or by shaping of the extracted current ripple into a pulse waveform and detecting, e.g., a zero-cross point. For example, Patent Document 1 describes a configuration that detects a spiky pulse output generated in the motor current when one commutator segment contacting the brush is switched to next commutator segment to thereby detect the motor rotation speed. Further, Patent Document 2 describes a configuration that improves rotation detection accuracy by increasing the current ripple when detecting the motor rotation speed by detecting the current ripple contained in the motor current.

CITATION LIST

Patent Document

Patent Document 1: JP 2009-159674 A
Patent Document 2: JP 2016-77130 A

DISCLOSURE OF THE INVENTION

Problems to be Solved by the Invention

The level of the waveform of the current ripple in the DC motor with a brush fluctuates in proportion to the motor current. However, the motor current significantly varies depending on a motor load state, so that the ripple waveform significantly fluctuates with the load variation. Further, the motor current is superimposed with brush noise generated from the motor. Therefore, in order to extract only the current ripple from the motor current containing these unstable factors and then to shape the extracted current ripple into a pulse waveform or the like, it is necessary to increase the ripple generation amount to some extent, as described in Patent Document 1.

However, in order to increase the current ripple, there is a need for changes such as ununiformization of magnetic pole pitch on a stator side. This may result in adverse effect (e.g., torque ripple increase) on motor original performance and characteristics and may increase motor noise and heat generation from the motor. Further, in order to perform wave shaping from the current ripple with a large variation, the adjustment of a filter needs to be elaborate. That is, for example, depending on the cut-off setting, if a current value may be out of the setting, which may cause problems such as non-output of the pulse, delay of the pulse, and the like.

Means for Solving the Problems

A motor control device according to an aspect of the present invention includes a ripple detection device that detects a current ripple contained in an armature current of a DC motor and outputs the current ripple as a rectangular wave signal, wherein the ripple detection device includes: a current detection part that detects the armature current and outputs a variation in the armature current as a voltage variation signal; a first smoothing part that extracts a current ripple component and a noise component from the voltage variation signal and outputs a first smoothing signal S1 composed of the current ripple component and noise component; a ripple detection part that extracts only the current ripple component from the first smoothing signal S1 by removing the noise component therefrom and outputs a ripple component signal S0; and a digital signal conversion part that converts the ripple component signal S0 into a digital signal.

A motor control device according to another aspect of the present invention includes a ripple detection device that detects a current ripple contained in an armature current of a DC motor and outputs the current ripple as a rectangular wave signal, wherein the ripple detection device includes: a current detection part that detects the armature current and outputs a variation in the armature current as a voltage variation signal; a first smoothing part that extracts a current ripple component and a noise component from the voltage variation signal and outputs a first smoothing signal S1 composed of the current ripple component and noise component; a gain adjustment part that adjusts an amplitude of the first smoothing signal S1 and outputs an adjustment signal VCA whose amplitude is made uniform; a second smoothing part that corrects distortion of the adjustment signal VCA and outputs a second smoothing signal S2 with a uniform amplitude having a constant center value; a ripple detection part that extracts only the current ripple component from the second smoothing signal S2 by removing the noise component therefrom and outputs a ripple component signal S0; and a digital signal conversion part that converts the ripple component signal S0 into a digital signal.

In the present invention, the motor control device is provided with the current detection part, first smoothing part, ripple detection part and digital signal conversion part and, in addition to the above components, the gain adjustment part and second smoothing part, whereby the current ripple is extracted from the motor current as a digital signal. Thus, it is not necessary to increase the current ripple by a change in magnetic pole pitch, etc. and, thus, the current ripple can be extracted without changing existing motor configurations. This allows ripple sensing without involving deterioration in motor performance and characteristics and without involving increase in motor noise and heat generation. Thus, it is possible to detect the rotation speed and the like of the DC motor without using a rotation detection member such as a hall IC.

In the motor control device, the first smoothing part may include: a first control voltage generation circuit that extracts a center value of the current ripple component from the voltage variation signal as a variation component of the armature current and outputs the extracted center value as a first control voltage CV1; and a first fluctuation component smoothing circuit that calculates a difference between the voltage variation signal and the first control voltage CV1 to remove a variation component of the armature current from the voltage variation signal and extract the current ripple component and noise component so as to form the first smoothing signal S1.

Further, the first smoothing part may include: a first control voltage generation circuit that extracts a center value of the current ripple component from the voltage variation signal as a variation component of the armature current and outputs the extracted center value as a first control voltage CV1; and a first fluctuation component smoothing circuit that calculates a difference between the voltage variation signal and the first control voltage CV1 to remove a variation component of the armature current from the voltage variation signal and extract the current ripple component and noise component so as to form the first smoothing signal S1, and the gain adjustment part may include: a control voltage inversion circuit that inverts a waveform of the first control voltage CV1 and outputs an inverted first control voltage CV1'; and a gain adjustment circuit that uses the inverted first control voltage CV1' to make the amplitude of the first smoothing signal S1 uniform.

The second smoothing part may include: a second control voltage generation circuit that extracts a center value of the adjustment signal VCA and outputs the extracted center value as a second control voltage CV2; and a second fluctuation component smoothing circuit that calculates a difference between the adjustment signal VCA and the second control voltage CV2 to remove a variation component of the adjustment signal VCA from the adjustment signal VCA so as to form the second smoothing signal S2.

The ripple detection part may include: a high-pass filter that extracts the noise component from the first smoothing signal S1 or the second smoothing signal S2; and a differential amplification circuit that is input with the first smoothing signal S1 or second smoothing signal S2 and a signal obtained by inverting a waveform of the noise component extracted by the high-pass filter, extracts only the current ripple component from the first smoothing signal S1 or second smoothing signal S2, and outputs the ripple component signal S0.

The digital signal conversion part may include: a phase shift part that generates a shift signal S0' by slightly shifting a phase of the ripple component signal S0; and a comparator that is input with the shift signal S0' and ripple component signal S0 and converts the ripple component signal S0 into a digital signal based on a magnitude relation between the signals S0 and S0'.

A DC motor current ripple detection method according to an aspect of the present invention is a method that detects a current ripple contained in an armature current of a DC motor and outputs the current ripple as a rectangular wave signal, the method including: detecting the armature current and outputting a variation in the armature current as a voltage variation signal (current detection step); extracting a current ripple component and a noise component from the voltage variation signal and outputting a first smoothing signal S1 composed of the current ripple component and noise component (first smoothing step); extracting only the current ripple component from the first smoothing signal S1 by removing the noise component therefrom and outputting a ripple component signal S0 (ripple detection step); and converting the ripple component signal S0 into a digital signal (digitalization step).

A DC motor current ripple detection method according to another aspect of the present invention is a method that detects a current ripple contained in an armature current of a DC motor and outputs the current ripple as a rectangular wave signal, the method including: detecting the armature current and outputting a variation in the armature current as a voltage variation signal; extracting a current ripple component and a noise component from the voltage variation signal and outputting a first smoothing signal S1 composed of the current ripple component and noise component; adjusting an amplitude of the first smoothing signal S1 and outputting an adjustment signal VCA whose amplitude is made uniform (gain adjustment step); correcting distortion of the adjustment signal VCA and outputting a second smoothing signal S2 with a uniform amplitude having a constant center value (second smoothing step); extracting only the current ripple component from the second smoothing signal S2 by removing the noise component therefrom and outputting a ripple component signal S0 (ripple detection step); and converting the ripple component signal S0 into a digital signal (digitization step).

In the present invention, the current detection step, first smoothing step, ripple detection step and digitization step are carried out and, further, the gain adjustment step and second smoothing step are carried out in addition to the above steps, whereby the current ripple is extracted from the motor current as a digital signal. Thus, it is not necessary to increase the current ripple by a change in magnetic pole pitch, etc. and, thus, the current ripple can be extracted without changing existing motor configurations. This allows ripple sensing without involving deterioration in motor performance and characteristics and without involving increase in motor noise and heat generation.

The current ripple detection method may include: extracting a center value of the current ripple component from the voltage variation signal as a variation component of the armature current and outputting the extracted center value as a first control voltage CV1 (first control voltage generation step); and calculating a difference between the voltage variation signal and the first control voltage CV1 to remove a variation component of the armature current from the voltage variation signal and extract the current ripple component and noise component so as to form the first smoothing signal S1 (first fluctuation component smoothing step).

The current ripple detection method may include: extracting a center value of the current ripple component from the voltage variation signal as a variation component of the armature current and outputting the extracted center value as a first control voltage CV1; calculating a difference between the voltage variation signal and the first control voltage CV1 to remove a variation component of the armature current from the voltage variation signal and extract the current ripple component and noise component so as to form the first smoothing signal S1; inverting a waveform of the first control voltage CV1 and outputting an inverted first control voltage CV1' (control voltage inversion step); and making the amplitude of the first smoothing signal S1 uniform by using the inverted first control voltage CV1' (gain adjustment step).

The current ripple detection method may include: extracting a center value of the adjustment signal VCA and outputting the extracted center value as a second control voltage CV2 (second control voltage generation step); and calculating a difference between the adjustment signal VCA and the second control voltage CV2 to remove a variation component of the adjustment signal VCA from the adjustment signal VCA so as to form the second smoothing signal S2 (second fluctuation component smoothing step).

The current ripple detection method may include: extracting the noise component from the first smoothing signal S1 or second smoothing signal S2 using a high-pass filter (noise component extraction step); and synthesizing the first smoothing signal S1 or second smoothing signal S2 and a signal obtained by inverting a waveform of the noise component extracted by the high-pass filter to extract only the current ripple component from the first smoothing signal S1 or second smoothing signal S2 and outputting the ripple component signal S0 (current ripple component extraction step).

The current ripple detection method may include: generating a shift signal S0' by slightly shifting a phase of the ripple component signal S0 (phase shift signal generation step); and converting the ripple component signal S0 into a digital signal based on a magnitude relation between the shift signal S0' and the ripple component signal S0 (digital conversion step).

Advantageous Effects of the Invention

According to the motor control device of the present invention, it is possible to extract the current ripple from the motor current as a digital signal. Thus, it is not necessary to increase the current ripple by a change in magnetic pole pitch, etc. and, thus, the current ripple can be extracted without changing existing motor configurations. This allows ripple sensing without involving deterioration in motor performance and characteristics and without involving increase in motor noise and heat generation. Thus, it is possible to detect the rotation speed, rotation direction, and the like of the DC motor without using a rotation detection member such as a hall IC.

According to the DC motor current ripple detection method of the present invention, it is possible to extract the current ripple from the motor current as a digital signal. Thus, it is not necessary to increase the current ripple by a change in magnetic pole pitch, etc. and, thus, the ripple can be extracted without changing existing motor configurations. This allows ripple sensing without involving deterioration in motor performance and characteristics and without involving increase in motor noise and heat generation.

BRIEF DESCRIPTION OF THE DRAWINGS

FIGS. 4A-4E are explanatory views illustrating processing to be performed in a first fluctuation component smoothing circuit.

FIGS. 6A-6C are explanatory views illustrating processing to be performed in an automatic gain adjustment circuit.

FIGS. 7A-7C are explanatory views illustrating processing to be performed in a second smoothing circuit block.

FIGS. 8A-8C are explanatory views illustrating processing to be performed in a ripple detection part.

FIGS. 9A-9D are explanatory views illustrating processing to be performed in a digital signal conversion part.

BEST MODE FOR CARRYING OUT THE INVENTION

Hereinafter, an embodiment of the present invention will be described in detail based on the accompanying drawings. The object of the embodiment described below is to provide a motor control device capable of detecting, in so-called sensorless positioning in which a motor rotation speed, a motor rotation direction and the like are detected without using a rotation detection member such as an hall IC, the motor rotation speed and the like from a normal motor current itself without involving operation of, e.g., increasing the current ripple.

Figure 1:
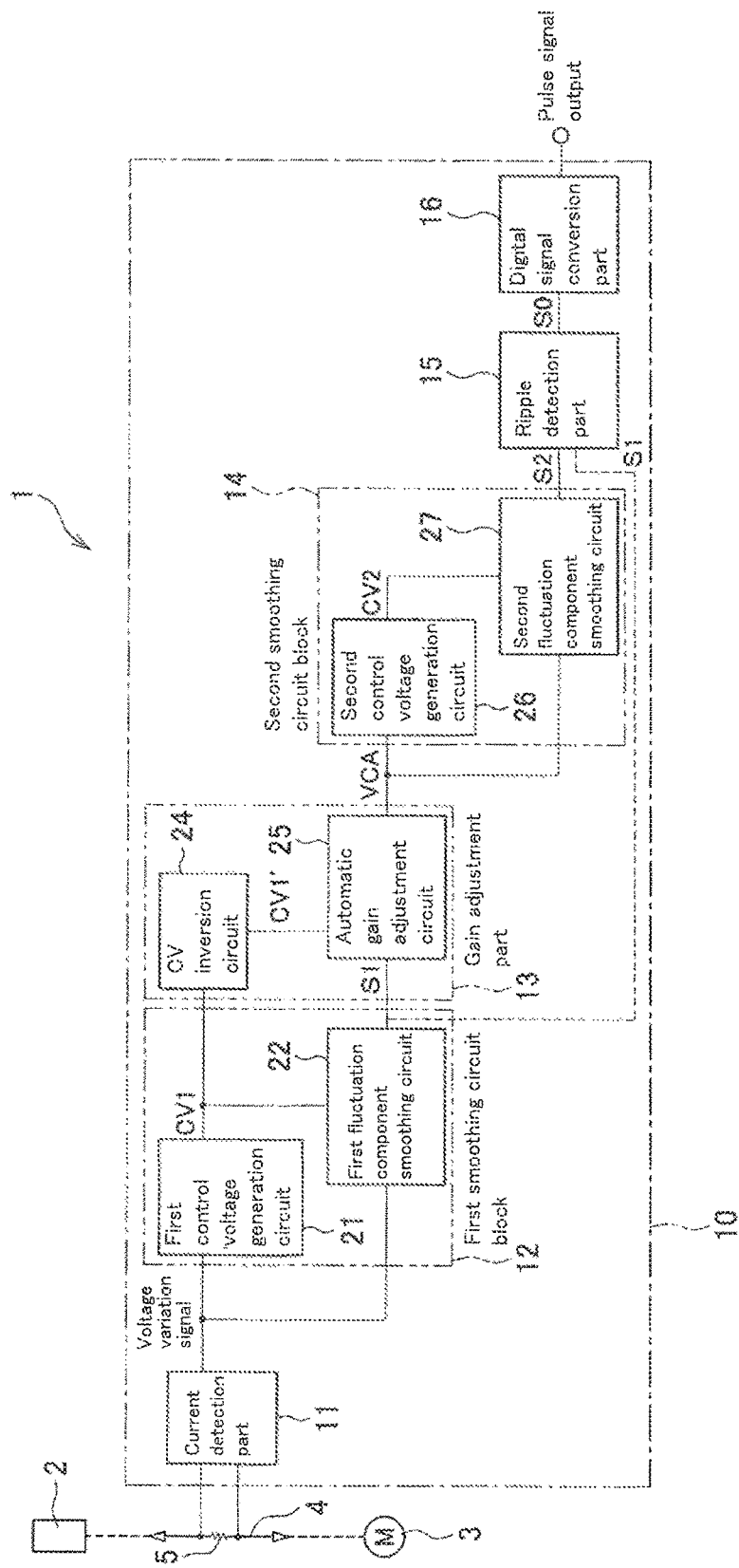
FIG. 1 is a block diagram illustrating the configuration of a motor control device which is an embodiment of the present invention.

FIG. 1 is a block diagram illustrating the configuration of a motor control device 1 which is an embodiment of the present invention. The motor control device 1 is applied to, e.g., operation control for a vehicle power wind motor and is configured to extract a current ripple contained in a motor current (armature current) without using a hall IC and the like, output the extracted current ripple in the form of a rectangular wave, and calculate the motor rotation speed, motor rotation direction, and the like. The motor control device 1 has a ripple detection device 10. The current ripple detection method of the present invention is carried out by the ripple detection device 10. The ripple detection device 10 is disposed on a power supply line 4 that supplies power from a power supply 2 to a brushed DC motor 3 (hereinafter, abbreviated as "motor 3"). A shunt resistor 5 is provided on the power supply line 4, and the ripple detection device 10 is connected before and after (power supply 2 side and motor 3 side) the shunt resistor 5.

As illustrated in FIG. 1, the ripple detection device 10 includes functional blocks of a current detection part 11, a first smoothing circuit block (first smoothing part) 12, a gain adjustment part 13, a second smoothing circuit block (second smoothing part) 14, a ripple detection part 15, and a digital signal conversion part 16 in this order from the shunt resistor 5 side. In the ripple detection device 10, the current detection part 11 detects a voltage difference (voltage drop) between before and after the shunt resistor 5 so as to detect a motor drive current and outputs the voltage difference as a voltage variation signal. The voltage variation signal is transmitted to the first smoothing circuit block 12 and its downstream-side functional blocks (gain adjustment part 13→second smoothing circuit block 14→ripple detection part 15) and, in this process, only a current ripple component is extracted from the voltage variation signal. The extracted current ripple component is converted into a pulse signal equivalent to an encoder output by the digital signal conversion part 16 and output therefrom. As a result, the rotation speed of the motor 3 is detected based on the pulse signal.

Figure 2:
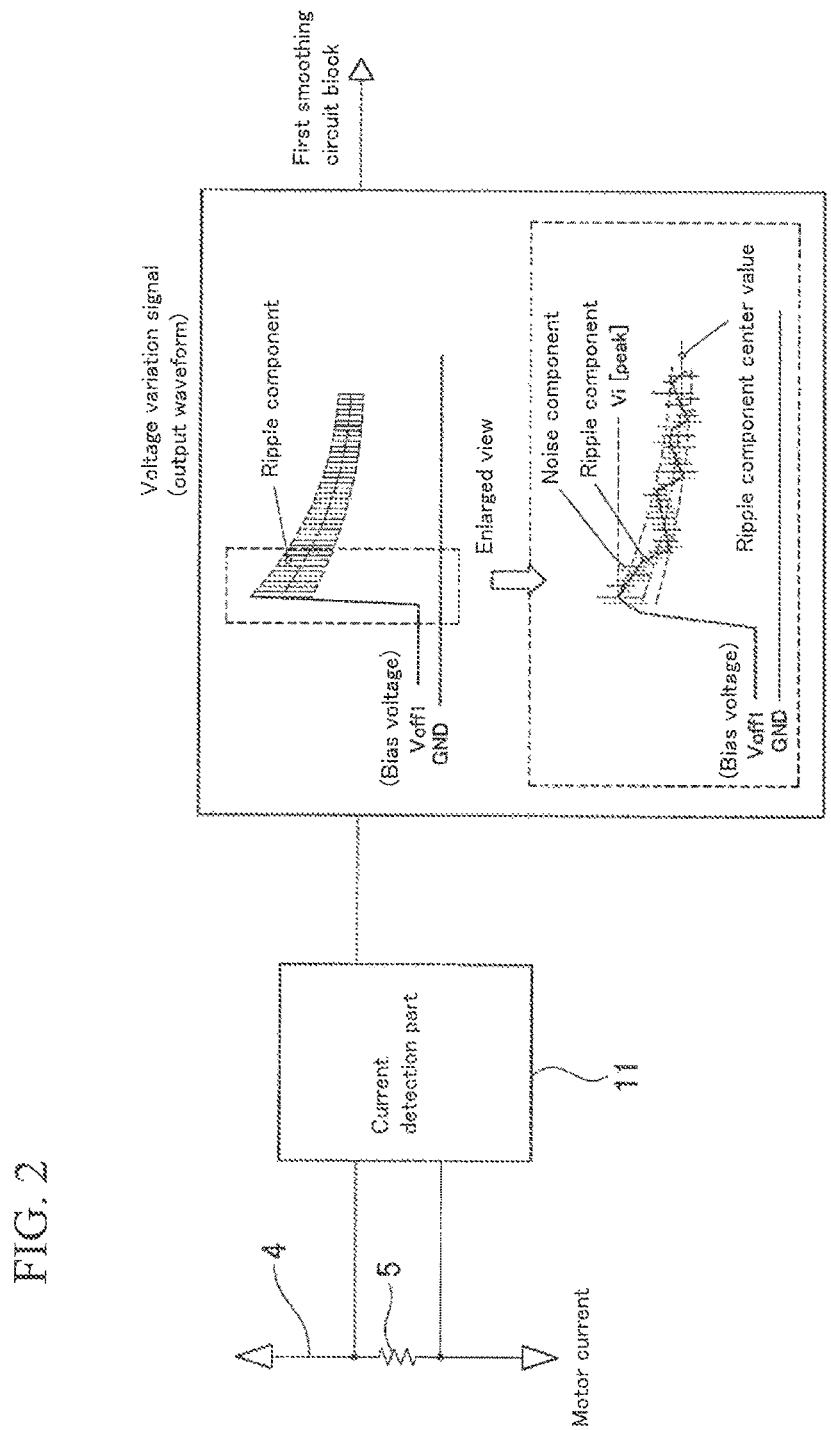
FIG. 2 is an example of an output signal from a current detection part.

Hereinafter, processing to be performed in the functional blocks of the ripple detection device 10 will be described step by step. As described above, the current detection part 11 detects a voltage difference between before and after the shunt resistor 5 and outputs the detected voltage difference as the voltage variation signal (current detection step). FIG. 2 illustrates an example of the output signal from the current detection part 11. In the current detection part 11, the voltage difference between before and after the shunt resistor 5 is differentially amplified with a bias voltage Voff1 based on a power supply voltage as a reference and output. As illustrated in FIG. 2, the voltage variation signal contains a noise component and a current ripple component. The voltage signal containing these components is output from the current detection part 11 to the first smoothing circuit block 12.

Figure 3:
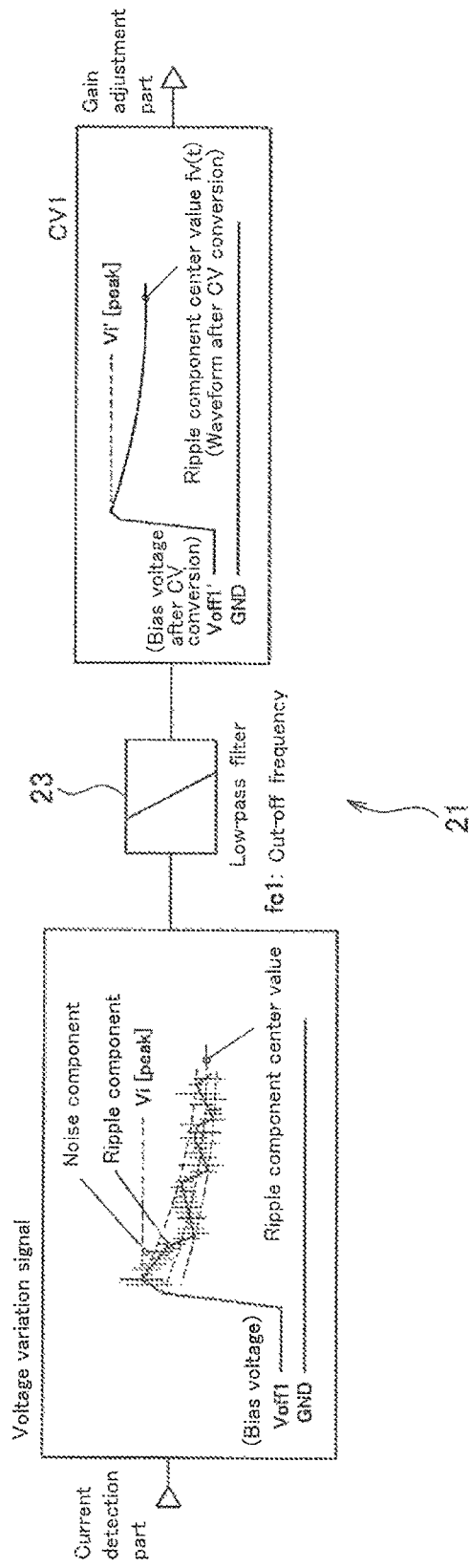
FIG. 3 is an explanatory view illustrating processing to be performed in a first control voltage generation circuit.

The first smoothing circuit block 12 includes a first control voltage (CV) generation circuit 21 and a first fluctuation component smoothing circuit 22 and extracts the current ripple component and noise component from the voltage variation signal of FIG. 2 (first smoothing step). FIG. 3 is an explanatory view illustrating processing to be performed in the first control voltage generation circuit 21, and FIGS. 4A-4E are explanatory views illustrating processing to be performed in the first fluctuation component smoothing circuit 22. The first control voltage generation circuit 21 uses a low-pass filter 23 to extract the center value of the current ripple component from the voltage variation signal (FIG. 2) input from the current detection part 11 as the variation component of the motor drive current (fv(t) of FIG. 3) and outputs the current ripple component center value as a first control voltage CV1 (first control voltage generation step).

In this case, the inclination of the ripple waveform is determined by the relationship between the inductance of the motor and a current variation caused when the brush bridges adjacent commutator segments. Thus, a cut-off frequency fc1 of the low-pass filter 23 for extracting the fv(t) is appropriately determined in a range between a frequency component due to the motor inductance and a ripple frequency component at the time of motor lock with a motor specification, an installation condition and the like taken into consideration. The first control voltage CV1 extracted in the first control voltage generation circuit 21 is output to the first fluctuation component smoothing circuit 22 and the gain adjustment part 13.

The first fluctuation component smoothing circuit 22 uses the first control voltage CV1 calculated in the first control voltage generation circuit 21 to extract the current ripple component (and noise component) from the voltage variation signal obtained in the current detection part 11. That is, the first fluctuation component smoothing circuit 22 calculates the difference between the voltage variation signal (FIG. 4A) of FIG. 2 and the first control voltage CV1 (FIG. 4C) to remove a variation (variation component) in the motor drive current from the voltage variation signal to thereby extract the current ripple component (and noise component) (FIG. 4E). At this time, as illustrated in FIGS. 4B and 4D, bias voltages Vref1 and Vref2 are used to match the voltage levels (waveform heights) of the voltage variation signal and first control voltage CV1. As a result, only the current ripple component and noise component are extracted, and a first smoothing signal S1 as illustrated in FIG. 4E is output (first fluctuation component smoothing step). As illustrated in FIG. 4E, the first smoothing signal S1 is a signal in which the center level of the waveform thereof is made constant, so that waveform shaping processing to be performed thereafter is facilitated, and certainty thereof is also enhanced.

Figure 5:
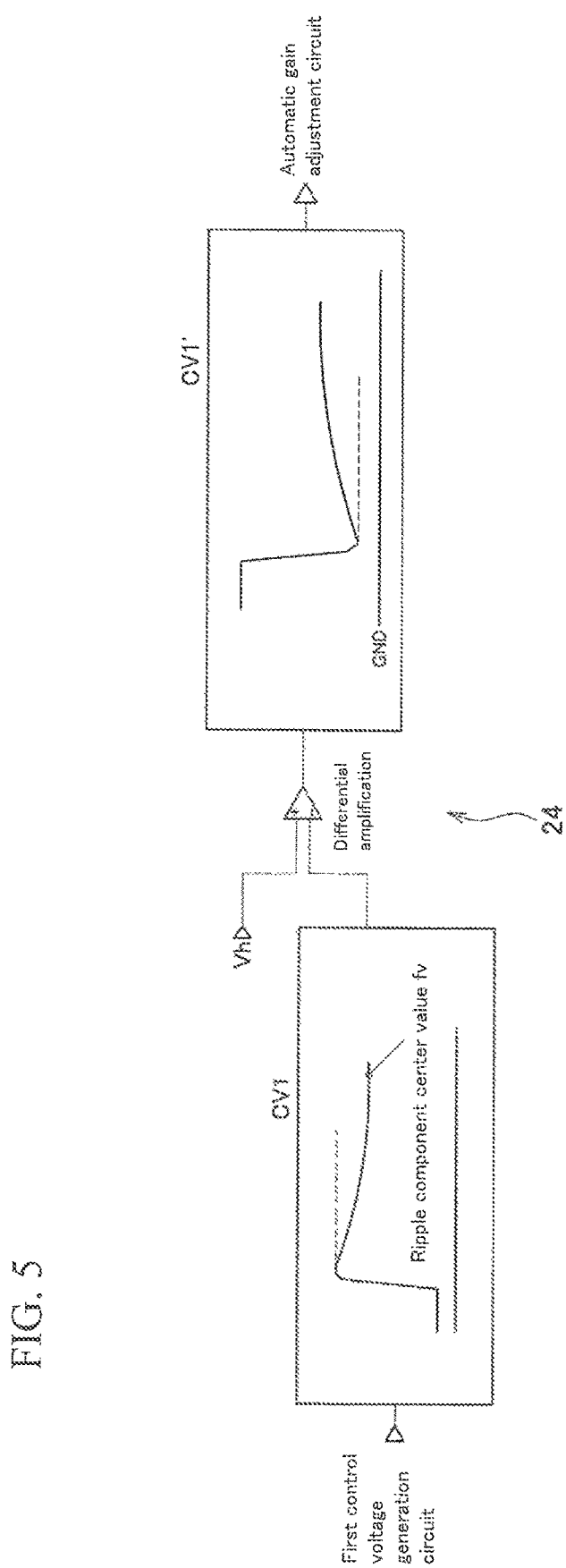
FIG. 5 is an explanatory view illustrating processing to be performed in a CV inversion circuit.

As illustrated in FIG. 4E, the signal obtained by the first fluctuation component smoothing circuit 22 involves an amplitude variation due to a variation in the motor current. Therefore, the signal of FIG. 4E is waveform-shaped into a signal having a uniform amplitude by the gain adjustment part 13 (gain adjustment step). The gain adjustment part 13 includes a CV inversion circuit (control voltage inversion circuit) 24 and an automatic gain adjustment circuit 25. FIG. 5 is an explanatory view illustrating processing to be performed in the CV inversion circuit 24, and FIGS. 6A-6C are explanatory views illustrating processing to be performed in the automatic gain adjustment circuit 25. The gain adjustment part 13 uses an inverted first control voltage CV1' (having an inverted phase to the first control voltage CV1) which is inverted by the CV inversion circuit 24 and the first smoothing signal S1 from the first fluctuation component smoothing circuit 22 to generate an adjustment signal VCA as illustrated in FIG. 6C.

As illustrated in FIG. 5, the CV inversion circuit 24 inverts the first control voltage CV1 input from the first control voltage generation circuit 21 up and down and outputs the inverted first control voltage CV1' (control voltage inversion step). The automatic gain adjustment circuit 25 multiplies the first smoothing signal S1 by the inverted first control voltage CV1' to make the amplitude of the first smoothing signal S1 uniform. That is, by multiplying the first smoothing signal S1 and the inverted first control voltage CV1' having a waveform upside down with respect to that of the first control voltage CV1, a portion having a large amplitude and a portion having a small amplitude are multiplied by a small voltage and a large voltage, respectively. As a result, as illustrated in FIG. 6C, the adjustment signal VCA having a uniform amplitude is output (gain adjustment step). This makes the level of the current ripple component uniform to enhance certainty of waveform shaping processing.

The adjustment signal VCA obtained in the gain adjustment part 13 is transmitted to the second smoothing circuit block 14 where it is smoothed once again (second smoothing step). As illustrated in FIG. 6C, although the adjustment signal VCA has a uniform amplitude, it is curved as a whole, following a variation in the inverted first control voltage CV1'. Thus, the smoothing processing is performed in the second smoothing circuit block 14 so as to correct the adjustment signal VCA into a linear signal having a constant center value. The second smoothing circuit block 14 includes a second control voltage generation circuit 26 and a second fluctuation component smoothing circuit 27 and performs the processing same as that in the first smoothing circuit block 12.

FIG. 7 is an explanatory view illustrating processing to be performed in the second smoothing circuit block 14. As illustrated in FIG. 7B, in the second smoothing circuit block 14 as well, a second control voltage CV2 is generated from the adjustment signal VCA in the second control voltage generation circuit 26 (second control voltage generation step). Then, the second fluctuation component smoothing circuit 27 generates a second smoothing signal S2 of FIG. 7C from the second control voltage CV2 and the adjustment signal VCA input from the gain adjustment part 13. That is, the second smoothing signal S2 as illustrated in FIG. 7C is formed by subtracting the second control voltage CV2 (FIG. 7B) denoted by the long dashed short dashed line from the waveform of FIG. 7A (second fluctuation component smoothing step).

As illustrated in FIG. 7C, the second smoothing signal S2 contains the current ripple component and noise component in a mixed state. Thus, the ripple detection part 15 extracts only the current ripple component from the second smoothing signal S2 (ripple detection step). FIGS. 8A-8C are explanatory views illustrating processing to be performed in the ripple detection part 15. In this case, the noise component is higher in frequency than the current ripple component, so that a high-pass filter 28 is used to extract only the noise component from the second smoothing signal S2 (FIG. 8A) (noise component extraction step) (FIG. 8B). At this time, a cut-off frequency fc2 of the high-pass filter 28 is set in a range between frequency components of the rise time and fall time of the current ripple component due to the motor inductance and a frequency component of the noise component based on appropriate verification and in accordance with a system specification.

After extraction of the noise component from the second smoothing signal S2, the extracted noise component is inverted and synthesized with the second smoothing signal S2. Specifically, the second smoothing signal S2 and an opposite-phase signal with respect to the noise component of the second smoothing signal S2 are input to a differential amplification circuit 29 to remove the noise component from the second smoothing signal S2, followed by amplification of the resultant second smoothing signal S2, whereby a ripple component signal S0 in which only the current ripple component is made apparent is formed and output (FIG. 8C). As a result, a signal having only the current ripple component as illustrated in FIG. 8C is extracted from the voltage variation signal of FIG. 2 (current ripple component extraction step). By thus removing the noise component from the second smoothing signal S2, it is possible to extract only the current ripple component without dulling the waveform of the current ripple.

After only the current ripple component is thus extracted, the extracted current ripple component is transmitted to the digital signal conversion part 16, where it is converted into a digital signal (digitization step). FIGS. 9A-9D are explanatory views illustrating processing to be performed in the digital signal conversion part 16. In the digital signal conversion part 16, the phase of the ripple component signal S0 (FIG. 9A) transmitted from the ripple detection part 15 is slightly shifted by a phase shift part 31 (phase shift signal generation step). Then, a comparator 32 compares the original ripple component signal S0 and a signal S0' whose phase is slightly shifted from the phase of the original ripple component signal S0 to generate a pulse signal as illustrated in FIG. 9D.

In this case, for example, the comparator 32 outputs an "H" signal when the signal S0 is larger than the signal S0' while it outputs an "L" signal when the signal S0' is larger than the signal S0. Thus, as illustrated in FIG. 9C, S0 is larger than S0' in the section P, so that "H" signal is output, while S0 is smaller than S0' in the section Q, so that "L" signal is output. As a result, a rectangular wave pulse signal corresponding to a variation in the ripple component signal S0 is formed and output (digital conversion step).

In the rectangular wave pulse signal thus formed, each of the pulses corresponds to switching of contact between the brush and the commutator segment. The numbers of the brushes and commutator segments are previously determined for each motor, so that the rotation speed of the motor 3 can be calculated by counting the number of the pulses. That is, it is possible to detect the rotation speed of the motor 3 from the current ripple contained in the motor current without using a rotation detection member such as a hall IC. At this time, in the device/method according to the present invention, it is not necessary to increase the current ripple by a change in magnetic pole pitch, etc. and, thus, the ripple can be extracted without changing existing motor configurations. This allows ripple sensing without involving deterioration in motor performance and characteristics and without involving increase in motor noise and heat generation.

Further, there is no need to provide a high precision filter and to perform a delicate cut-off setting, thus preventing problems such as pulse non-output and pulse delay.

The present invention is not limited to the above embodiment, but may be variously modified without departing from the spirit and scope of the invention.

For example, in the above embodiment, the second smoothing signal S2 is input from the first smoothing circuit block 12 to the ripple detection part 15 through the gain adjustment part 13 and second smoothing circuit block 14; however, in the case of a signal containing less current ripple component (e.g., a current waveform in which a motor current less fluctuates), processing in the gain adjustment part 13 and second smoothing circuit block 14 may be omitted. That is, as denoted by the dashed line of FIG. 1, the first smoothing signal S1 output from the first smoothing circuit block 12 may be directly input to the ripple detection part 15. Further, there may be a case where the signal containing less current ripple component can be processed in the ripple detection part 15 without uniformization of the ripple component in the gain adjustment part 13. In this case, the gain adjustment part 13 and the second smoothing circuit block 14 (that corrects waveform fluctuation generated due to gain adjustment) used as a set with the gain adjustment part 13 may be omitted.

Further, in the above embodiment, the ripple detection part 15 extracts only the noise component from the second smoothing signal S2, inverts the extracted noise component, and adds the inverted noise component to the second smoothing signal S2. Alternatively, however, the noise component (not inverted) may be subtracted from the second smoothing signal S2.

INDUSTRIAL APPLICABILITY

The motor control device and current ripple detection method according to the present invention can be widely applied not only to operation control for a power window motor, but also to other on-vehicle electric devices such as a wiper and a power seat, and home electric appliances using a brushed motor.

REFERENCE SIGNS LIST

1: Motor control device
2: Power supply
3: Brushed CD motor
4: Power supply line
5: Shunt resistor
10: Ripple detection device
11: Current detection part
12: First smoothing circuit block (first smoothing part)
13: Gain adjustment part
14: Second smoothing circuit block (second smoothing part)
15: Ripple detection part
16: Digital signal conversion part
21: First control voltage generation circuit
22: First fluctuation component smoothing circuit
23: Low-pass filter
24: CV inversion circuit
25: Automatic gain adjustment circuit
26: Second control voltage generation circuit
27: Second fluctuation component smoothing circuit
28: High-pass filter
29: Differential amplification circuit
31: Phase shift part
32: Comparator CV1: First control voltage
CV'1: Inverted first control voltage
CV2: Second control voltage
S0: Ripple component signal
S0': Shift signal
S1: First smoothing signal
S2: Second smoothing signal
VCA: Adjustment signal
Voff1: Bias voltage
Vref1: Bias voltage
Vref2: Bias voltage
fc1: Cut-off frequency
fc2: Cut-off frequency

The invention claimed is:

1. A motor control device comprising a ripple detection device that detects a current ripple contained in an armature current of a DC motor and outputs the current ripple as a rectangular wave signal, wherein
the ripple detection device includes:
a current detection part that detects the armature current and outputs a variation in the armature current as a voltage variation signal;
a first smoothing part that extracts a current ripple component and a noise component from the voltage variation signal and outputs a first smoothing signal S1 composed of the current ripple component and noise component;
a ripple detection part that extracts only the current ripple component from the first smoothing signal S1 by removing the noise component therefrom and outputs a ripple component signal S0; and
a digital signal conversion part that converts the ripple component signal S0 into a digital signal.

2. The motor control device according to claim 1, wherein the first smoothing part includes:
a first control voltage generation circuit that extracts a center value of the current ripple component from the voltage variation signal as a variation component of the armature current and outputs the extracted center value as a first control voltage CV1; and
a first fluctuation component smoothing circuit that calculates a difference between the voltage variation signal and the first control voltage CV1 to remove a variation component of the armature current from the voltage variation signal and extract the current ripple component and noise component so as to form the first smoothing signal S1.

3. The motor control device according to claim 1, wherein the ripple detection part includes:
a high-pass filter that extracts the noise component from the first smoothing signal S1 or second smoothing signal S2; and
a differential amplification circuit that is input with the first smoothing signal S1 or the second smoothing signal S2 and a signal obtained by inverting a waveform of the noise component extracted by the high-pass filter, extracts only the current ripple component from the first smoothing signal S1 or the second smoothing signal S2, and outputs the ripple component signal S0.

4. The motor control device according to claim 1, wherein the digital signal conversion part includes:
a phase shift part that generates a shift signal S0' by slightly shifting a phase of the ripple component signal S0; and
a comparator that is input with the shift signal S0' and the ripple component signal S0 and converts the ripple component signal S0 into a digital signal based on a magnitude relation between the signals S0 and S0'.

5. A motor control device comprising a ripple detection device that detects a current ripple contained in an armature current of a DC motor and outputs the current ripple as a rectangular wave signal, wherein
the ripple detection device includes:
a current detection part that detects the armature current and outputs a variation in the armature current as a voltage variation signal;
a first smoothing part that extracts a current ripple component and a noise component from the voltage variation signal and outputs a first smoothing signal S1 composed of the current ripple component and noise component;
a gain adjustment part that adjusts an amplitude of the first smoothing signal S1 and outputs an adjustment signal VCA whose amplitude is made uniform;
a second smoothing part that corrects distortion of the adjustment signal VCA and outputs a second smoothing signal S2 with a uniform amplitude having a constant center value;
a ripple detection part that extracts only the current ripple component from the second smoothing signal S2 by removing the noise component therefrom and outputs a ripple component signal S0; and
a digital signal conversion part that converts the ripple component signal S0 into a digital signal.

6. The motor control device according to claim 5, wherein the first smoothing part includes:
a first control voltage generation circuit that extracts a center value of the current ripple component from the voltage variation signal as a variation component of the armature current and outputs the extracted center value as a first control voltage CV1; and
a first fluctuation component smoothing circuit that calculates a difference between the voltage variation signal and the first control voltage CV1 to remove a variation component of the armature current from the voltage variation signal and extract the current ripple component and noise component so as to form the first smoothing signal S1, and
the gain adjustment part includes:
a control voltage inversion circuit that inverts a waveform of the first control voltage CV1 and outputs an inverted first control voltage CV1'; and
a gain adjustment circuit that uses the inverted first control voltage CV1' to make the amplitude of the first smoothing signal S1 uniform.

7. The motor control device according to claim 5, wherein the second smoothing part includes:
a second control voltage generation circuit that extracts a center value of the adjustment signal VCA and outputs the extracted center value as a second control voltage CV2; and
a second fluctuation component smoothing circuit that calculates a difference between the adjustment signal VCA and the second control voltage CV2 to remove a variation component of the adjustment signal VCA from the adjustment signal VCA so as to form the second smoothing signal S2.

8. A current ripple detection method for a DC motor that detects a current ripple contained in an armature current of the DC motor and outputs the current ripple as a rectangular wave signal, the method comprising:
detecting the armature current and outputting a variation in the armature current as a voltage variation signal;

extracting a current ripple component and a noise component from the voltage variation signal and outputting a first smoothing signal S1 composed of the current ripple component and noise component;

extracting only the current ripple component from the first smoothing signal S1 by removing the noise component therefrom and outputting a ripple component signal S0; and converting the ripple component signal S0 into a digital signal.

9. The current ripple detection method according to claim 8, comprising:

extracting a center value of the current ripple component from the voltage variation signal as a variation component of the armature current and outputting the extracted center value as a first control voltage CV1; and calculating a difference between the voltage variation signal and the first control voltage CV1 to remove a variation component of the armature current from the voltage variation signal and extract the current ripple component and the noise component so as to form the first smoothing signal S1.

10. The current ripple detection method according to claim 8, comprising:

extracting the noise component from the first smoothing signal S1 or the second smoothing signal S2 using a high-pass filter; and synthesizing the first smoothing signal S1 or the second smoothing signal S2 and a signal obtained by inverting a waveform of the noise component extracted by the high-pass filter to extract only the current ripple component from the first smoothing signal S1 or the second smoothing signal S2 and outputting the ripple component signal S0.

11. The current ripple detection method according to claim 8, comprising:

generating a shift signal S0' by slightly shifting a phase of the ripple component signal S0; and converting the ripple component signal S0 into a digital signal based on a magnitude relation between the shift signal S0' and the ripple component signal S0.

12. A current ripple detection method for a DC motor that detects a current ripple contained in an armature current of the DC motor and outputs the current ripple as a rectangular wave signal, the method comprising:

detecting the armature current and outputting a variation in the armature current as a voltage variation signal;

extracting a current ripple component and a noise component from the voltage variation signal and outputting a first smoothing signal S1 composed of the current ripple component and the noise component;

adjusting an amplitude of the first smoothing signal S1 and outputting an adjustment signal VCA whose amplitude is made uniform;

correcting distortion of the adjustment signal VCA and outputting a second smoothing signal S2 with a uniform amplitude having a constant center value;

extracting only the current ripple component from the second smoothing signal S2 by removing the noise component therefrom and outputting a ripple component signal S0; and converting the ripple component signal S0 into a digital signal.

13. The current ripple detection method according to claim 12, comprising:

extracting a center value of the current ripple component from the voltage variation signal as a variation component of the armature current and outputting the extracted center value as a first control voltage CV1;

calculating a difference between the voltage variation signal and the first control voltage CV1 to remove a variation component of the armature current from the voltage variation signal and extract the current ripple component and the noise component so as to form the first smoothing signal S1;

inverting a waveform of the first control voltage CV1 and outputting an inverted first control voltage CV1'; and making the amplitude of the first smoothing signal S1 uniform by using the inverted first control voltage CV1'.

14. The current ripple detection method according to claim 12, comprising:

extracting a center value of the adjustment signal VCA and outputting the extracted center value as a second control voltage CV2; and calculating a difference between the adjustment signal VCA and the second control voltage CV2 to remove a variation component of the adjustment signal VCA from the adjustment signal VCA so as to form the second smoothing signal S2.

* * * * *